(12) United States Patent
Chiu

(10) Patent No.: US 11,076,464 B2
(45) Date of Patent: Jul. 27, 2021

(54) CONTROL METHOD AND DRIVING CIRCUIT FOR LIGHT EMITTING DIODE

(71) Applicant: NOVATEK Microelectronics Corp., Hsinchu (TW)

(72) Inventor: Hsiang-Yi Chiu, New Taipei (TW)

(73) Assignee: NOVATEK Microelectronics Corp., Hsinchu (TW)

(*) Notice: Subject to any disclaimer, the term of this patent is extended or adjusted under 35 U.S.C. 154(b) by 174 days.

(21) Appl. No.: 16/562,457

(22) Filed: Sep. 6, 2019

(65) Prior Publication Data
US 2021/0076463 A1    Mar. 11, 2021

(51) Int. Cl.
*H05B 45/37* (2020.01)
*H05B 45/10* (2020.01)
*H03K 19/20* (2006.01)

(52) U.S. Cl.
CPC ............ *H05B 45/37* (2020.01); *H05B 45/10* (2020.01); *H03K 19/20* (2013.01)

(58) Field of Classification Search
CPC ........ H05B 45/00; H05B 45/10; H05B 45/30; H05B 45/37; H05B 45/325; H03K 19/20; H03K 9/08
See application file for complete search history.

(56) References Cited

U.S. PATENT DOCUMENTS

| | | | | |
|---|---|---|---|---|
| 8,890,909 B2* | 11/2014 | Fukutoku | ............... | H05B 45/37 |
| | | | | 345/691 |
| 2012/0013265 A1* | 1/2012 | Yang | ...................... | H05B 45/37 |
| | | | | 315/246 |
| 2013/0147385 A1* | 6/2013 | Yang | ...................... | H05B 47/10 |
| | | | | 315/224 |
| 2015/0015426 A1* | 1/2015 | Lindahl | .................... | H03K 9/08 |
| | | | | 341/53 |
| 2018/0180978 A1* | 6/2018 | Yamada | ............... | H05B 47/165 |
| 2019/0028090 A1* | 1/2019 | Rao | ......................... | H03K 3/017 |
| 2019/0110349 A1* | 4/2019 | Tsukahara | .......... | G03B 21/2053 |

* cited by examiner

*Primary Examiner* — Alexander H Taningco
*Assistant Examiner* — Pedro C Fernandez
(74) *Attorney, Agent, or Firm* — CKC & Partners Co., LLC

(57) ABSTRACT

A driving circuit, for providing a driving current to a light emitting diode, includes a PWM demodulator, a current source and a local clock generator. The PWM demodulator is configured to sample a PWM input signal in reference with a local clock signal and generate a brightness code according to a duty ratio of the PWM input signal. The current source is coupled with the PWM demodulator and the light emitting diode. The current source is configured to generate the driving current with a current amplitude according to the brightness code. The local clock generator is configured to generate the local clock signal according to a global clock signal during a first cycle period of successive cycle periods of the PWM input signal. The local clock generator suspends oscillation of the local clock signal during a second cycle period of the successive cycle periods of the PWM input signal.

26 Claims, 12 Drawing Sheets

CONTROL METHOD AND DRIVING CIRCUIT FOR LIGHT EMITTING DIODE

BACKGROUND

Field of Invention

The disclosure relates to a driving circuit. More particularly, the disclosure relates to the driving circuit for a light emitting diode and a control method thereof.

Description of Related Art

Light emitting diodes are important electronic components as steady and efficient light sources, which can be utilized as light bulbs, light pipes, backlight modules or active display cells in some electronic display panels. Light emitting diodes are controlled by driving currents, which are produced by a driving circuit. The driving circuit is configured to generate the driving currents with specific current amplitude to modulate brightness of the light emitting diodes.

SUMMARY

The disclosure provides a control method, which include following steps. A PWM input signal is received. During a first cycle period of successive cycle periods of the PWM input signal, a local clock signal is generated at least according to a global clock signal. During the first cycle period, the local clock signal is utilized to sample and calculate a first duty ratio of a PWM input signal. A brightness code is updated according to the first duty ratio. A driving current is generated to a LED according to the brightness code. During a second cycle period of the successive cycle periods of the PWM input signal after the first cycle period, oscillation of the local clock signal is suspended.

The disclosure also provides a control method, which include following steps. A pulse width modulation (PWM) input signal is received. During a first cycle period of successive cycle periods of the PWM input signal, a local clock signal is generated at least according to a global clock signal. During the first cycle period, the local clock signal is utilized to sample and calculate a first duty ratio of a PWM input signal. During a second cycle period of the successive cycle periods of the PWM input signal, the local clock signal is generated. During the second cycle period, the local clock signal is utilized to sample and calculate a second duty ratio of the PWM input signal. In response to that the second duty ratio equals to the first duty ratio, a clock suspended portion of the local clock signal is increased among the successive cycle periods of the PWM input signal. Oscillation of the local clock signal is suspended during the clock suspended portion of the successive cycle periods of the PWM input signal.

The disclosure also provides a driving circuit which is configured to provide a driving current to a light emitting diode. The driving circuit includes a PWM demodulator, a current source and a local clock generator. The PWM demodulator is configured to sample a PWM input signal in reference with a local clock signal and generate a brightness code according to a duty ratio of the PWM input signal. The current source is coupled with the PWM demodulator and the light emitting diode. The current source is configured to generate the driving current with a current amplitude according to the brightness code. The local clock generator is configured to generate the local clock signal at least according to a global clock signal during a first cycle period of successive cycle periods of the PWM input signal. The local clock generator suspends oscillation of the local clock signal during a second cycle period of the successive cycle periods of the PWM input signal.

It is to be understood that both the foregoing general description and the following detailed description are demonstrated by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
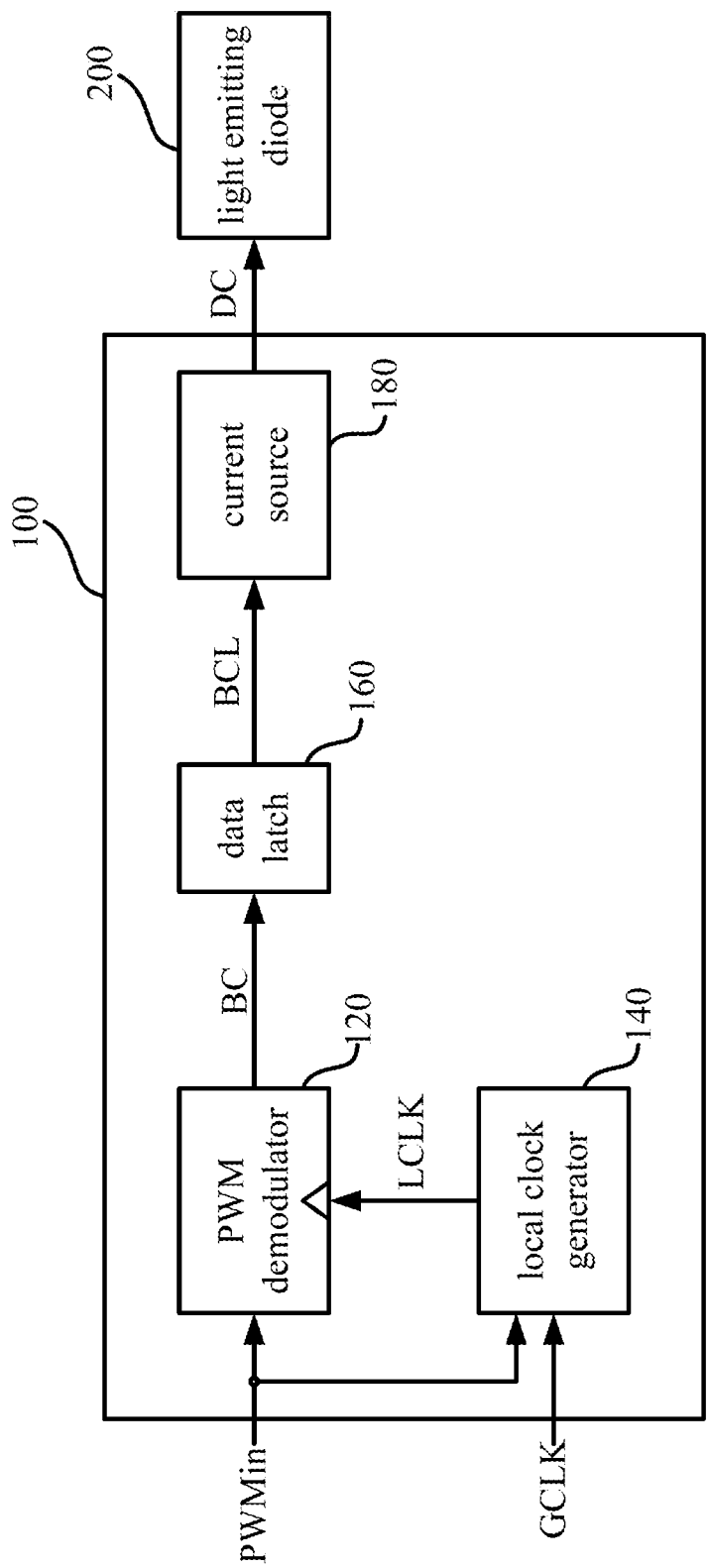
FIG. 1 is a schematic diagram illustrating a driving circuit according to some embodiments of the disclosure.

Reference can now be made in detail to the present embodiments of the disclosure, examples of which are illustrated in the accompanying drawings. Wherever possible, the same reference numbers are used in the drawings and the description to refer to the same or like parts.

Reference is made to FIG. 1, which is a schematic diagram illustrating a driving circuit 100 according to some embodiments of the disclosure. The driving circuit 100 is configured to generate a driving current DC to at least one light emitting diode (LED) 200. FIG. 1 is illustrated with a single LED for explanation purpose but the disclosure is not limited thereto. The light emitting diode 200 is activated and driven by the driving current DC to illuminate at a brightness gray level. The brightness gray level of the light emitting diode 200 is affected by a current amplitude of the driving current DC. As shown in FIG. 1, the driving circuit 100 receives a pulse width modulation (PWM) input signal PWMin, and the driving circuit 100 is configured to generate the driving current DC with specific current amplitude according to the PWM input signal PWMin.

In some embodiments as shown in FIG. 1, the driving circuit 100 includes a PWM demodulator 120, a local clock generator 140 and a current source 180. The PWM demodulator 120 is configured to sample the PWM input signal PWMin in reference with a local clock signal LCLK generated by the local clock generator 140, and so as to generate a brightness code BC according to a duty ratio of the PWM input signal PWMin.

In some embodiments as shown in FIG. 1, the driving circuit 100 further includes the data latch 160. The data latch 160 is coupled between the PWM demodulator 120 and the current source 180. The data latch 160 is configured to latch the brightness code BC generated by the PWM demodulator 120. This brightness code BCL latched by the data latch 160 is provided to the current source 180. In this case, the current source 180 generates a driving current DC according to the brightness code BCL latched by the data latch 160.

The current source 180 is coupled between the PWM demodulator 120 and the LED 200. In the embodiments shown in FIG. 1, the current source 180 is coupled between the data latch 160 and the LED 200. The current source 180 is configured to generate the driving current DC with the current amplitude according to the brightness code BCL latched by the data latch 160. In some embodiments, the brightness code BC or the brightness code BCL is a digital code including 10 data bits representing 1024 (i.e., $2^{10}$) different brightness levels. For example, the current source 180 can generate the driving current DC with a higher current amplitude (e.g., 10 mA) when the brightness code BC/BCL is set as "800", and the current source 180 can generate the driving current DC with a lower current amplitude (e.g., 8.125 mA or 8 mA) when the brightness code BC/BCL is set as "650".

As shown in FIG. 1, the local clock generator 140 is coupled to the PWM demodulator 120. The local clock generator 140 is configured to generate the local clock signal LCLK at least according to a global clock signal GCLK. In some embodiments, the global clock signal GCLK is an always-on clock signal, which oscillates between a high level and a low level at a clock frequency.

If the PWM demodulator 120 is configured to sample the PWM input signal PWMin in reference with the global clock signal GCLK, the PWM demodulator 120 can be activated to sample the PWM input signal PWMin and calculate the duty ratio of the PWM input signal PWMin, and the PWM demodulator 120 can consume a lot of power in aforesaid sampling and calculation.

According to some embodiments, the local clock generator 140 is configured to generate the local clock signal LCLK according to a global clock signal GCLK. The local clock signal LCLK generated by the local clock generator 140 is not an always-on clock signal, and the local clock signal LCLK has at least one clock suspended portion. During the clock suspended portion, the local clock signal LCLK remains at a fixed level (e.g., the local clock signal LCLK can remains at a low level, or at a high level). Outside the clock suspended portion, the local clock signal LCLK can oscillate between the high level and a low level at a clock frequency.

Since, the local clock signal LCLK generated by the local clock generator 140 has aforesaid clock suspended portion, the PWM demodulator 120 can be configured to stop the sampling of the PWM input signal PWMin during the clock suspended portion of the local clock signal LCLK, such that the power consumption of at least one of the PWM demodulator 120 and the entire driving circuit 100 can be reduced.

Details and embodiments about how to generate the local clock signal LCLK are explained in following paragraphs.

Figure 2:
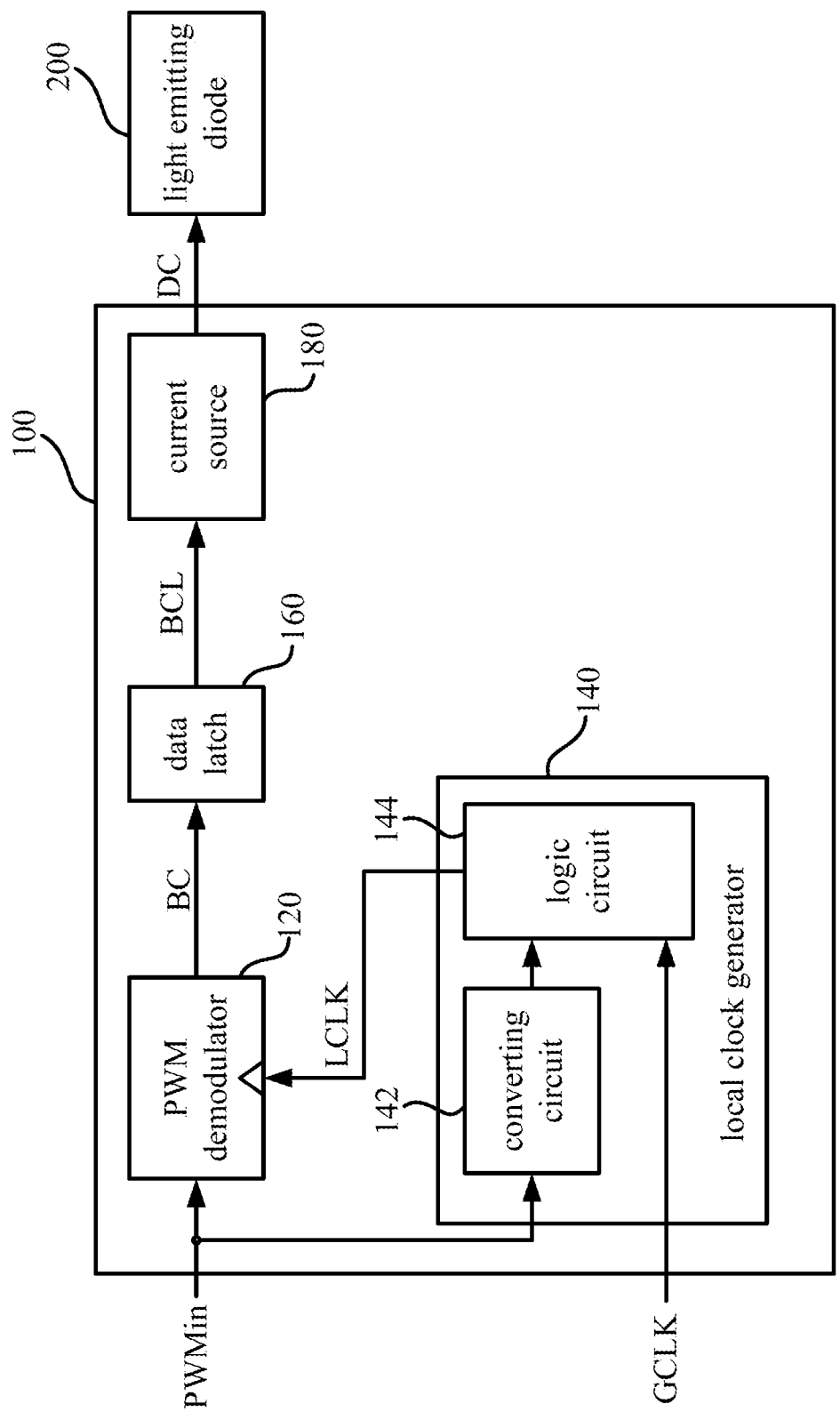
FIG. 2 is a schematic diagram illustrating the local clock generator of the driving circuit in FIG. 1.

Reference is further made to FIG. 2, which is a schematic diagram illustrating the local clock generator 140 of the driving circuit 100 in FIG. 1.

As shown in FIG. 2, the local clock generator 140 in some embodiments includes a converting circuit 142 and a logic circuit 144. The converting circuit 142 is configured to convert the PWM input signal PWMin into at least one output signal. The logic circuit 144 is coupled to the converting circuit 142. The logic circuit 144 is configured to generate the local clock signal LCLK according to the global clock signal GCLK and the at least one output signal converted by the converting circuit 142. In some embodiments, the converting circuit 142 can include a frequency dividing circuit for converting the PWM input signal PWMin into the at least one output signal.

Figure 3:
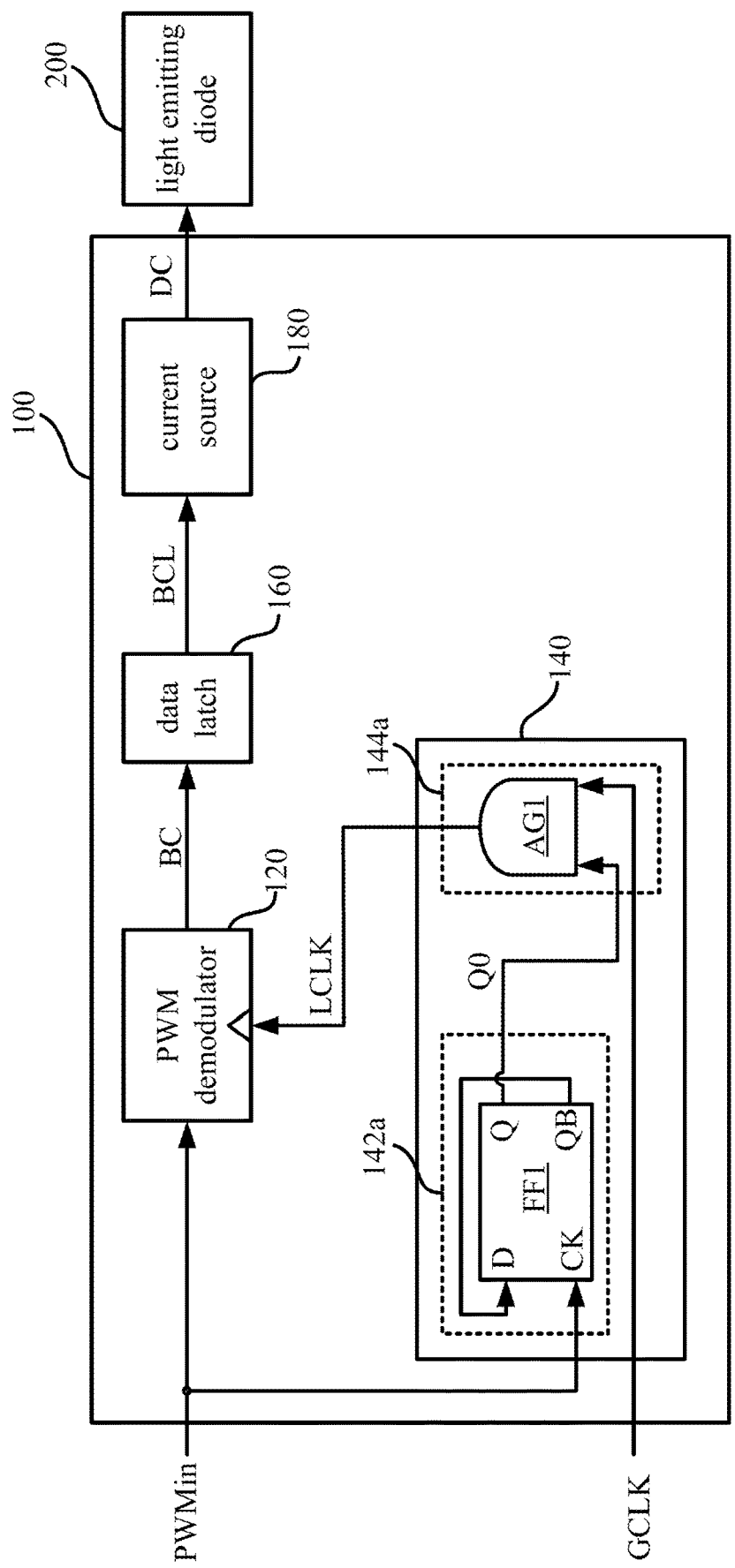
FIG. 3 is a circuitry diagram illustrating an embodiment of the local clock generator in FIG. 1 and FIG. 2.
Figure 4:
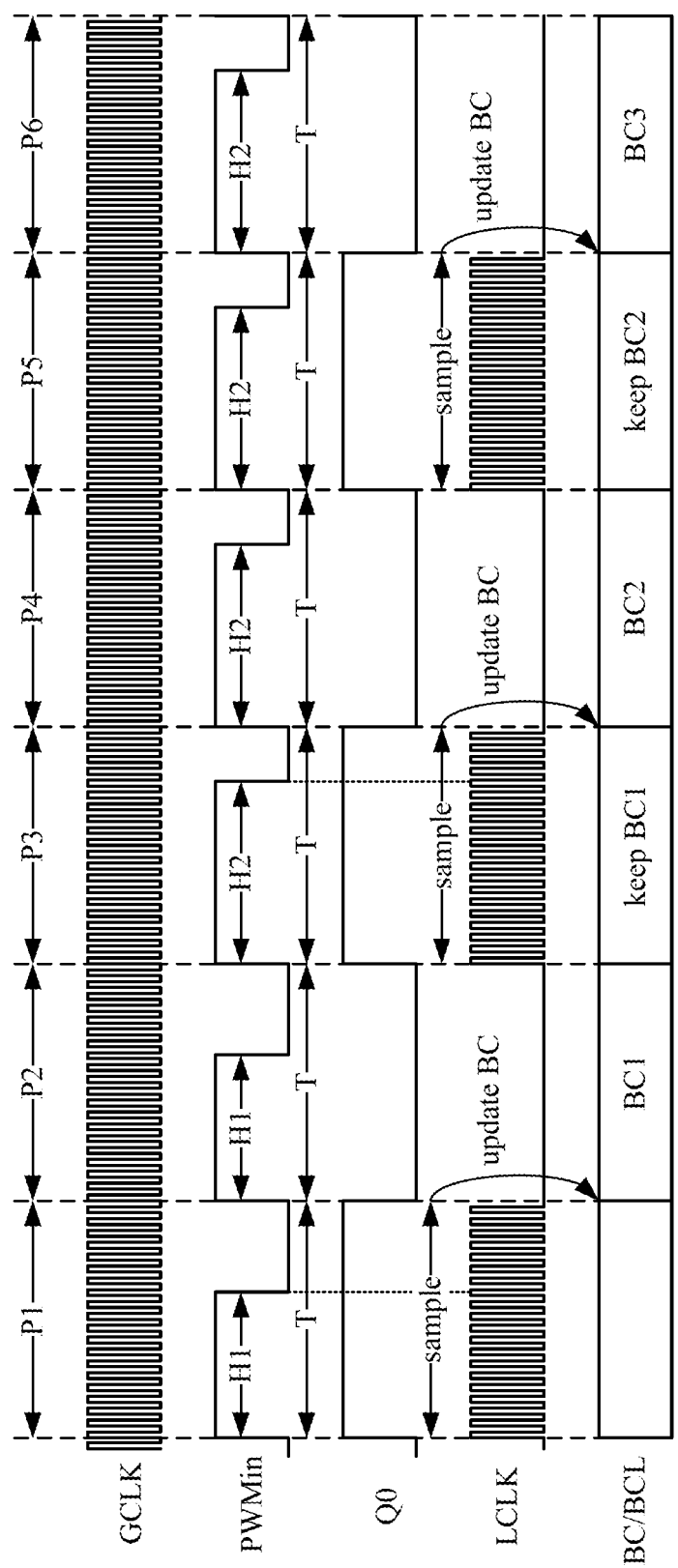
FIG. 4 is a signal waveform diagram illustrating a relationship between operating signals related to the local clock generator shown in FIG. 3.

Reference is further made to FIG. 3 and FIG. 4. FIG. 3 is a circuitry diagram illustrating an embodiment of the local clock generator 140 in FIG. 1 and FIG. 2. FIG. 4 is a signal waveform diagram illustrating a relationship between operating signals related to the local clock generator 140 shown in FIG. 3.

As shown in FIG. 3, the local clock generator 140 includes the converting circuit 142a and the logic circuit 144a. In the embodiment in FIG. 3, the converting circuit 142a includes a first flip-flop FF1. The first flip-flop FF1 includes a data input terminal D, a clock terminal CK, a positive data output terminal Q and a negative data output terminal QB. The clock terminal CK is configured to receive the PWM input signal PWMin. The positive data output terminal Q is configured to provide a first output signal Q0 (as the output signal generated by the converting circuit 142a). The negative data output terminal QB is coupled with the data input terminal D of the first flip-flop FF1, so as to feedback the negative data output to the data input terminal D. The first flip-flop FF1 is configured to be a divide-by-2 toggle flip-flop to divide the PWM input signal PWMin.

As will be explained, the local clock generator 140 can duplicate the global clock signal GCLK as the local clock signal LCLK in one or more cycle periods such as P1, P3 and P5 shown in FIG. 4, and can suspend the oscillation of the local clock signal LCLK in one or more periods such as P2, P4 and P6 shown in FIG. 4.

As shown in FIG. 3 and FIG. 4, the PWM input signal PWMin is a periodic signal. The first flip-flop FF1 can be triggered to change (flip) the first output signal Q0 at every rising edge of the PWM input signal PWMin. Therefore, the first output signal Q0 is changed from a low level to a high level at the beginning of the cycle period P1; the first output signal Q0 is changed from the high level to the low level at the beginning of the cycle period P2; and the first output signal Q0 is changed from the low level to the high level at the beginning of the cycle period P3, and so on. The first output signal Q0 can toggle at a half frequency relative to the PWM input signal PWMin.

As shown in FIG. 3 and FIG. 4, the logic circuit 144a include an AND gate AG1. The AND gate AG1 includes two input terminals and an output terminal. Two input terminals of the AND gate AG1 are configured to receive the first output signal Q0 and the global clock signal GCLK. The output terminal of the AND gate AG1 is configured to provide the local clock signal LCLK. In this case, the first output signal Q0 can allow the global clock signal GCLK to pass the AND gate AG1 in cycle periods P1, P3 and P5, and block the global clock signal GCLK in cycle periods P2, P4 and P6.

In summary, based on the embodiments shown in FIG. 3 and FIG. 4, the local clock generator 140 can duplicate the global clock signal GCLK as the local clock signal LCLK in the cycle periods P1, P3 and P5, and can suspend the oscillation of the local clock signal LCLK in the cycle periods P2, P4 and P6. It is noted that FIG. 4 is illustrated with the local clock signal LCLK periodically suspended but the disclosure is not limited thereto. In other embodiments, the local clock signal LCLK can have suspension time arranged according to any timing to meet design and application requirements.

In this case, the PWM demodulator 120 is configured to sample the PWM input signal PWMin in reference with the local clock signal LCLK generated by the local clock generator 140 in the cycle periods P1, P3 and P5.

Figure 5:
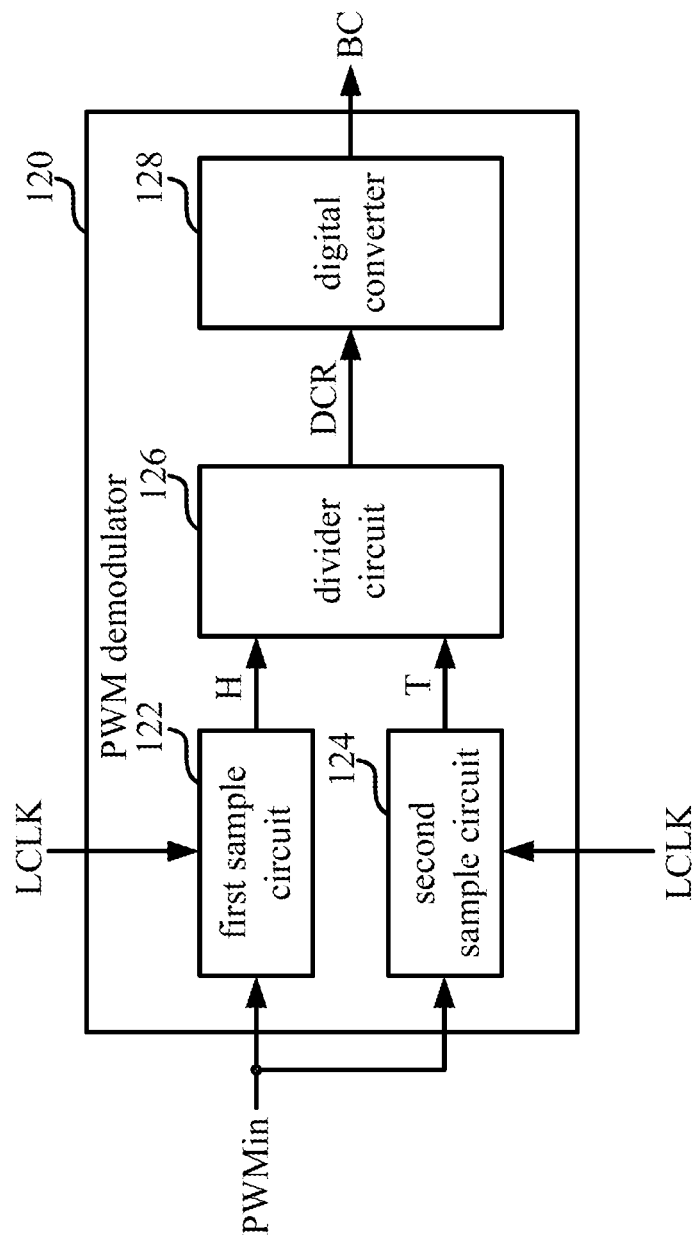
FIG. 5 is a schematic diagram illustrating an embodiment of the PWM demodulator in FIG. 1 and FIG. 2.

Reference is further made to FIG. 5, which is a schematic diagram illustrating an embodiment of the PWM demodulator 120 in FIG. 1 and FIG. 2. As shown in FIG. 5, the PWM demodulator 120 includes a first sample circuit 122, a second sample circuit 124, a divider circuit 126 and a digital converter 128.

As shown in FIG. 4 and FIG. 5, during the cycle periods P1, P3 and P5, the first sample circuit 122 is configured to calculate a pulse width H of the PWM input signal PWMin in reference with the local clock signal LCLK, and also the second sample circuit configured to calculate a time length T of one cycle period of the PWM input signal PWMin in reference with the local clock signal LCLK. The divider circuit 126 is configured to calculate duty ratios DCR of the PWM input signal PWMin in each one of the cycle periods P1, P3 and P5. After the calculation of the duty ratios DCR is completed, the digital converter 128 is configured to convert the duty ratios DCR into a brightness code BC for controlling the current source 180.

In the cycle period P1, the pulse width H of the PWM input signal PWMin can be sampled as "13" pulses of the local clock signal LCLK, and the time length T of one cycle period of the PWM input signal PWMin can be sampled as "20" pulses of the local clock signal LCLK. At the end of the cycle period P1, the sampling of the PWM input signal PWMin is completed. In this case, the duty ratio DCR of the PWM input signal PWMin in the cycle period P1 can be calculated by the divider circuit 126 as 65% (i.e., 13/20). The digital converter 128 can map the duty ratio DCR, 65%, in cycle period P1 into a corresponding brightness code BC1. At the end of the cycle period P1, for example, the brightness code BC1 can be updated to "666" (i.e., 1024*0.65=665.6≈666).

It is noticed that the sampling resolution of the local clock signal LCLK relative to the PWM input signal PWMin (e.g., there are 20 pulses of the local clock signal LCLK in one cycle period of the PWM input signal PWMin) as shown in FIG. 4 is illustrated as a demonstrational example for understanding. In practical applications, the local clock signal LCLK may have a higher frequency than the demonstrational embodiment shown in FIG. 4. For example, the local clock signal LCLK may have 256, 512, 1024, 2048 or more pulses (not shown in figures) in one cycle period of the PWM input signal PWMin. In another case (not shown in figures), the duty ratio DCR of the PWM input signal PWMin in a cycle period can be calculated by the divider circuit 126 as 29.296875% (assumed that the pulse width H=600 pulses, and the time length T=2048 pulses, and the 600/2048=0.29296875). The digital converter 128 can map the duty ratio DCR, 29.296875%, in the cycle period into a corresponding brightness code BC. At the end of the cycle period, for example, the brightness code can be update to "300" (i.e., 1024*0.29296875=300).

In some embodiments, the brightness code BC1 "666" can be kept by the data latch 160 as shown in FIG. 1 to FIG. 3, the current source 180 can generate the driving current DC according to the brightness code BC1 until the next time that the brightness code is updated.

As shown in FIG. 3 and FIG. 4, in the cycle period P2, the oscillation of the local clock signal LCLK is suspended. Therefore, the PWM input signal PWMin in the cycle period P2 cannot be sampled. In this case, the power consumption of the PWM demodulator 120 can be reduced. The brightness code BC1 is latched by the data latch 160 according to the sampling result during the cycle period P1.

In practical applications, the duty ratio DCR of the PWM input signal PWMin cannot be fixed at a certain level. When the duty ratio DCR of the PWM input signal PWMin changes, the driving circuit 100 is required to detect the variance of the duty ratio DCR of the PWM input signal PWMin and generate the brightness code BC/BCL and the driving current DC correspondingly.

In the embodiment shown in FIG. 4, the PWM input signal PWMin has a different duty cycle in the cycle period P3. During the cycle period P3, the brightness code BC1 is latched by the data latch 160 according to the sampling result during the cycle period P1. At the end of the cycle period P3, the pulse width H of the PWM input signal PWMin can be sampled as "16" pulses of the local clock signal LCLK, and the time length T of one cycle period of the PWM input signal PWMin can be sampled as "20" pulses of the local clock signal LCLK. At the end of the cycle period P3, the duty ratio DCR of the PWM input signal PWMin in the cycle period P3 can be calculated by the divider circuit 126 as 80% (i.e., 16/20). The digital converter 128 can map the duty ratio DCR, 80%, in cycle period P3, into a corresponding brightness code BC2. At the end of the cycle period P3, for example, the brightness code BC2 can be configured as 819 (i.e., 1024*0.8=819.2≈819).

In some embodiments, the brightness code BC2 "819" can be kept by the data latch 160 as shown in FIG. 1 to FIG. 3, the current source 180 can generate the driving current DC according to the brightness code BC2 until the next time that the brightness code is updated.

As shown in FIG. 3 and FIG. 4, in the cycle period P4, the oscillation of the local clock signal LCLK is suspended. Therefore, the PWM input signal PWMin in the cycle period P4 cannot be sampled. In this case, the power consumption of the PWM demodulator 120 can be reduced. The brightness code BC2 is latched by the data latch 160 according to the sampling result during the cycle period P3.

During the cycle period P5, the brightness code BC2 is latched by the data latch 160 according to the sampling result during the cycle period P3. At the end of the cycle period P5, the duty ratio DCR of the PWM input signal PWMin in the cycle period P5 can be calculated by the divider circuit 126 as 80% (i.e., 16/20). The digital converter 128 can map the duty ratio DCR, 80%, in cycle period P5, into a corresponding brightness code BC3. At the end of the cycle period P5, for example, the brightness code BC3 can be configured as 819 (i.e., 1024*0.8=819.2≈819). In this case, the duty ratio DCR remains at 80%, such that the brightness code BC3 is equal to the brightness code BC2.

As shown in FIG. 3 and FIG. 4, in the cycle period P6, the oscillation of the local clock signal LCLK is suspended. Therefore, the PWM input signal PWMin in the cycle period P6 cannot be sampled. In this case, the power consumption of the PWM demodulator 120 can be reduced. The brightness code BC3 is latched by the data latch 160 according to the sampling result during the cycle period P5.

In the embodiment shown in FIG. 3 and FIG. 4, the oscillation of the local clock signal LCLK is suspended in 50% of the successive cycle periods of the PWM input signal PWMin. In this case, the clock suspended portion of the local clock signal is 50% as shown in embodiments of FIG. 3 and FIG. 4.

As shown in FIG. 4, the oscillation of the local clock signal is suspended periodically in the cycle period P2, P4 and P6. The oscillation of the local clock signal is suspended during one cycle periods of successive two cycle periods of the PWM input signal.

Figure 6:
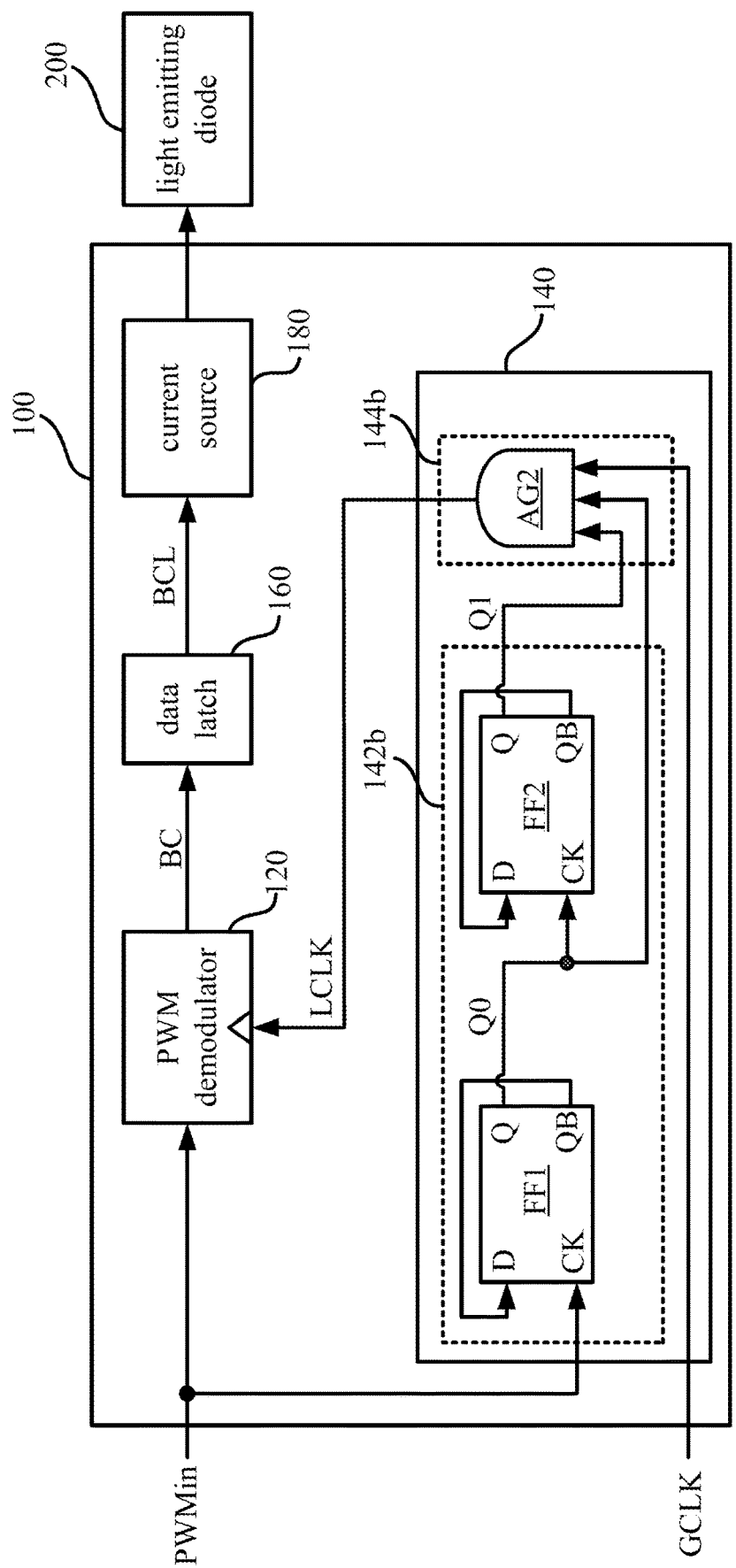
FIG. 6 is a circuitry diagram illustrating another embodiment of the local clock generator in FIG. 1 and FIG. 2.
Figure 7:
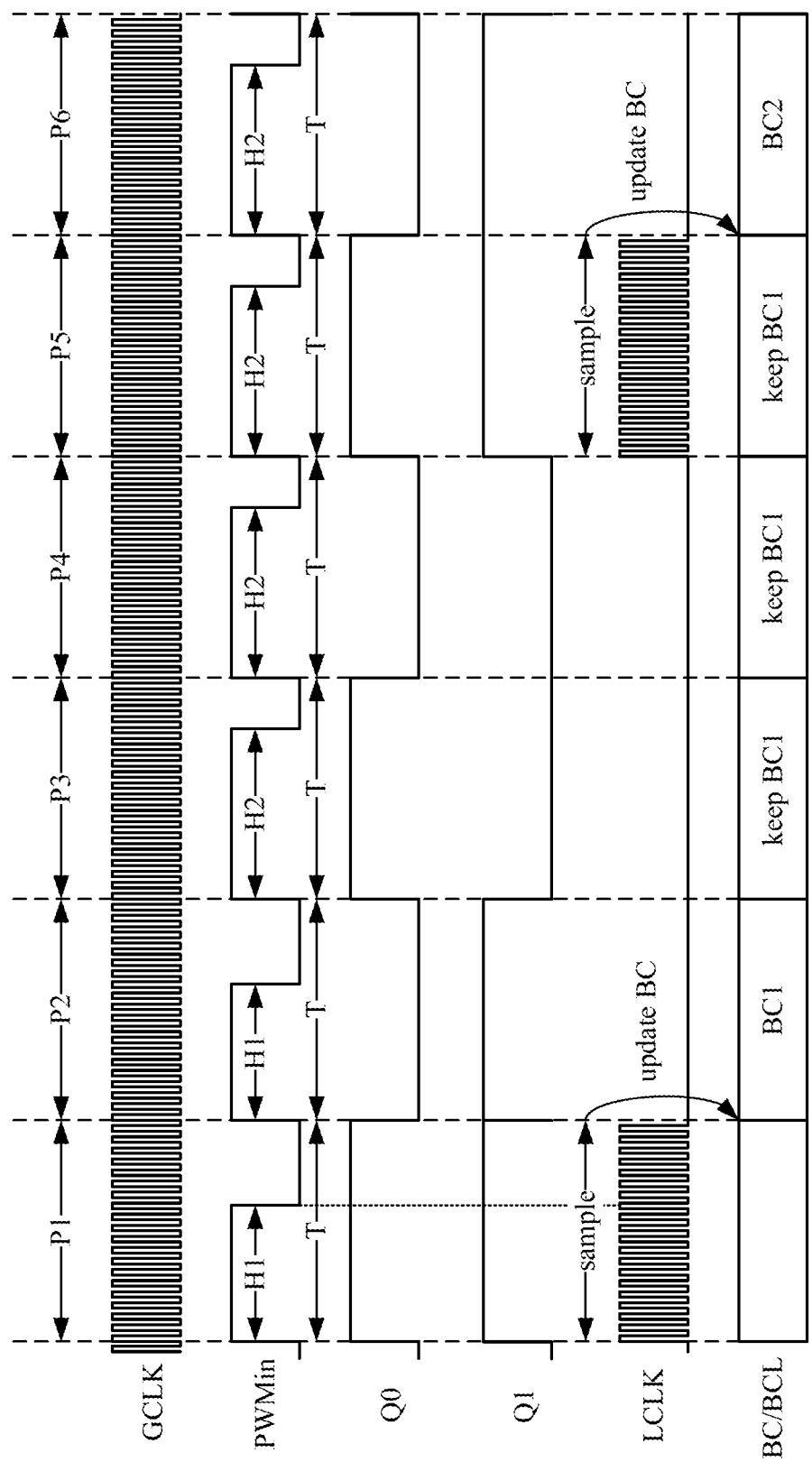
FIG. 7 is a signal waveform diagram illustrating a relationship between operating signals related to the local clock generator shown in FIG. 6.

In aforesaid embodiments shown in FIG. 3, the local clock generator 140 includes a divide-by-2 toggle flip-flop to divide the PWM input signal PWMin. However, the disclosure is not limited thereto. Reference is further made to FIG. 6 and FIG. 7.

Reference is further made to FIG. 6 and FIG. 7. FIG. 6 is a circuitry diagram illustrating another embodiment of the local clock generator 140 in FIG. 1 and FIG. 2. FIG. 7 is a signal waveform diagram illustrating a relationship between operating signals related to the local clock generator 140 shown in FIG. 6.

As shown in FIG. 6, the local clock generator 140 includes the converting circuit 142b and the logic circuit 144b. In the embodiment in FIG. 6, the converting circuit 142b includes a first flip-flop FF1 and a second flip-flop FF2.

The first flip-flop FF1 includes a data input terminal D, a clock terminal CK, a positive data output terminal Q and a negative data output terminal QB. The clock terminal CK is configured to receive the PWM input signal PWMin. The positive data output terminal Q is configured to provide a first output signal QO. The negative data output terminal QB is coupled with the data input terminal D of the first flip-flop FF1, so as to feedback the negative data output to the data input terminal D.

The second flip-flop FF2 also includes a data input terminal D, a clock terminal CK, a positive data output terminal Q and a negative data output terminal QB. The clock terminal CK of the second flip-flop FF2 is coupled to the positive data output terminal Q of the first flip-flop FF1 and configured to receive the first output signal Q0. The positive data output terminal Q of the second flip-flop FF2 is configured to provide a second output signal Q1. The negative data output terminal QB is coupled with the data input terminal D of the second flip-flop FF2, so as to feedback the negative data output to the data input terminal D. The first flip-flop FF1 and the second flip-flop FF2 are configured to be a divide-by-4 toggle flip-flops to divide the PWM input signal PWMin.

As shown in FIG. 6, the logic circuit 144b include an AND gate AG2. The AND gate AG2 includes three input terminals and an output terminal. Three input terminals of the AND gate AG1 are configured to receive the first output signal Q0, the second output signal Q1 and the global clock signal GCLK. The output terminal of the AND gate AG1 is configured to provide the local clock signal LCLK. In this case, the first output signal Q0 and the second output signal Q1 can allow the global clock signal GCLK to pass the AND gate AG2 in one of every four successive cycle periods of the PWM input signal PWMin, and block the global clock signal GCLK in other cycle periods. As shown in FIG. 7, the first output signal Q0 and the second output signal Q1 can allow the global clock signal GCLK to pass the AND gate AG2 in the cycle periods P1 and P5, and block the global clock signal GCLK in the cycle periods P2-P4 and P6.

As shown in FIG. 7, in the cycle period P1, the duty ratio DCR of the PWM input signal PWMin in the cycle period P1 can be calculated by the divider circuit 126 as 65% (i.e., 13/20). The digital converter 128 can map the duty ratio DCR, 65%, in cycle period P1 into a corresponding brightness code BC1. At the end of the cycle period P1, for example, the brightness code BC1 can be update to "666" (i.e., 1024*0.65=665.6≈666).

In some embodiments, the brightness code BC1 "666" can be kept by the data latch 160 as shown in FIG. 1 to FIG. 3, the current source 180 can generate the driving current DC according to the brightness code BC1 until the next time that the brightness code is updated.

As shown in FIG. 7, in the cycle periods P2, P3 and P4, the oscillation of the local clock signal LCLK is suspended. Therefore, the PWM input signal PWMin in the cycle period P2, P3 and P4 can not be sampled. In this case, the power consumption of the PWM demodulator 120 can be reduced. The brightness code BC1 is latched by the data latch 160 according to the sampling result during the cycle period P1.

During the cycle period P5, the brightness code BC1 is latched by the data latch 160 according to the sampling result during the cycle period P1. At the end of the cycle period P5, the duty ratio DCR of the PWM input signal PWMin in the cycle period P5 can be calculated by the divider circuit 126 as 80% (i.e., 16/20). The digital converter 128 can map the duty ratio DCR, 80%, in the cycle period P5, into a corresponding brightness code BC2. At the end of the cycle period P5, for example, the brightness code BC2 can be updated to 819 (i.e., 1024*0.8=819.2≈819).

As shown in FIG. 7, the oscillation of the local clock signal is suspended periodically in the cycle periods P2, P3, P4, P6 and also another two cycle periods after the cycle period P6. The oscillation of the local clock signal is suspended during three cycle periods of successive four cycle periods of the PWM input signal.

In other words, the oscillation of the local clock signal LCLK is suspended during N cycle periods of successive M cycle periods of the PWM input signal. N and M are positive integers and N<M. N and M are not limited to N=1 and M=2 (as shown in FIG. 3) or N=3 and M=4 (as shown in FIG. 7). N and M can be configured to different configuration based on practical demands.

In some other embodiments, the local clock generator 140 is not limited to the converting circuit 142a/142b and the logic circuit 144a/144b as shown in FIG. 3 or FIG. 6. The local clock generator 140 may include a series of cascading connected flip-flops (not shown in figures) and an AND gate. A clock terminal of a first flip-flop of the series of cascading connected flip-flops is configured for receiving the PWM input signal. A positive data output terminal of a last flip-flop of the series of cascading connected flip-flops is configured for generating an output signal. The AND gate (not shown in figures) include input terminals and an output terminal. The input terminals of the AND gate are configured to receive the at least one output signal from the last flip-flop and the global clock signal respectively, and the output terminal of the AND gate is configured for providing the local clock signal.

In the embodiment shown in FIG. 6 and FIG. 7, the oscillation of the local clock signal LCLK is suspended in 75% of the successive cycle periods of the PWM input signal PWMin. In this case, the clock suspended portion of the local clock signal is 75% as shown in embodiments of FIG. 6 and FIG. 7.

Figure 8:
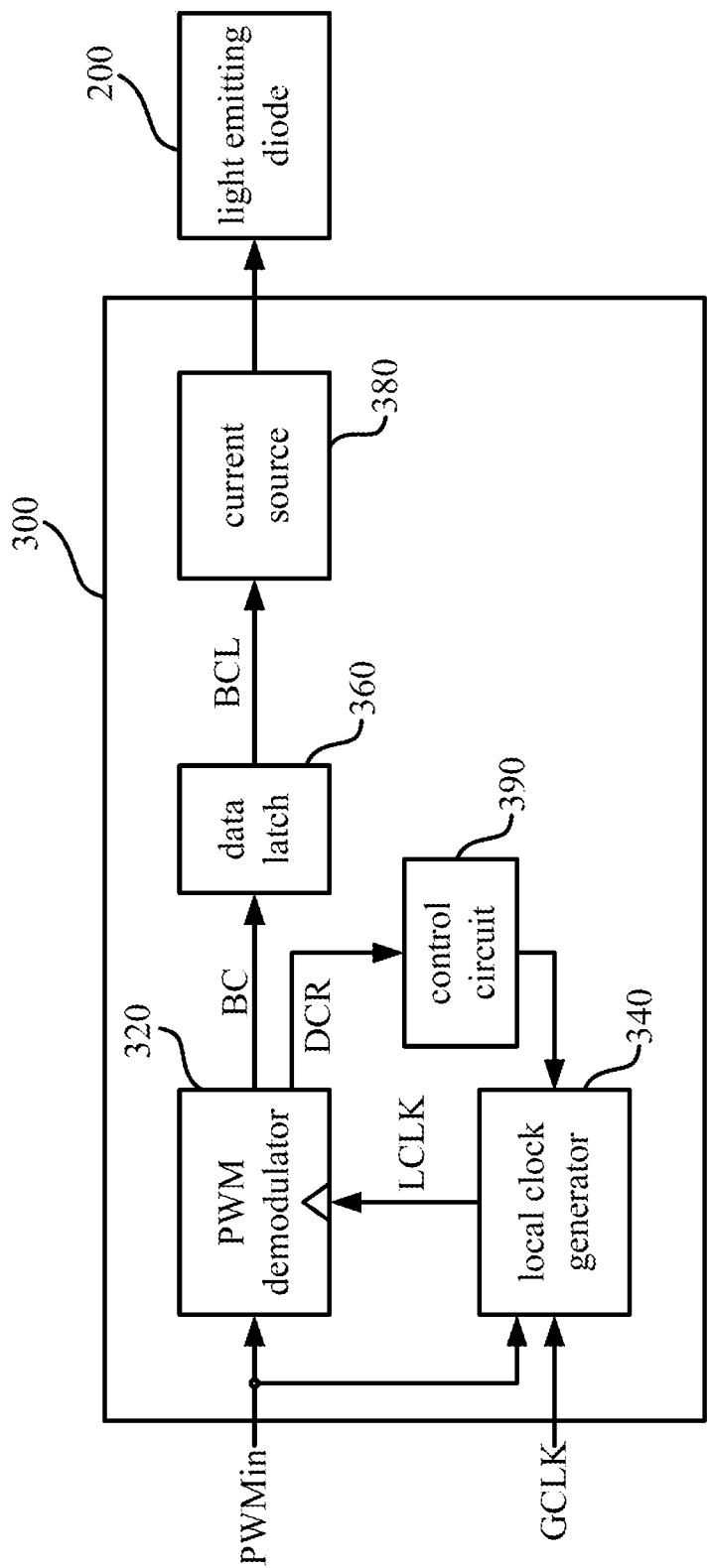
FIG. 8 is a schematic diagram illustrating a driving circuit according to some embodiments of the disclosure.

Reference is further made to FIG. 8, which is a schematic diagram illustrating a driving circuit 300 according to some embodiments of the disclosure. The driving circuit 300 is configured to generate a driving current DC to a light emitting diode (LED) 200. The driving circuit 300 in FIG. 8 includes a PWM demodulator 320, a local clock generator 340, a data latch 360 and a current source 380, which are similar to the PWM demodulator 120, a local clock generator 140, a data latch 160 and a current source 180 of the driving circuit 100 in aforesaid embodiments in FIG. 1 and FIG. 2, and not to be repeated here.

As shown in FIG. 8, the driving circuit 300 further includes a control circuit 390 coupled between the PWM demodulator 320 and the local clock generator 340. The control circuit 390 is configured to receive the duty ratio DCR calculated by the PWM demodulator 320 (referring to embodiments of the PWM demodulator 120 in FIG. 5 about how to calculate the duty ratio DCR), and the control circuit 390 control the local clock generator 340 to generate the local clock signal LCLK with different clock suspended portions.

In some embodiments, the local clock generator 340 in FIG. 8 can include a direct pass circuit (not show in figures) to pass the global clock signal GCLK as the local clock signal LCLK (no clock suspended portion). In addition, the local clock generator 340 in FIG. 8 also includes the converting circuit 142*a* and the logic circuit 144*a* in FIG. 3 for generate the local clock signal LCLK with the 50% clock suspended portion and also the converting circuit 142*b* and the logic circuit 144*b* in FIG. 7 for generate the local clock signal LCLK with the 75% clock suspended portion. In some embodiments, the control circuit 390 is configured to switch the local clock generator 340 between aforesaid different modes (no clock suspended portion, 50% clock suspended portion, 75% clock suspended portion).

Figure 9:
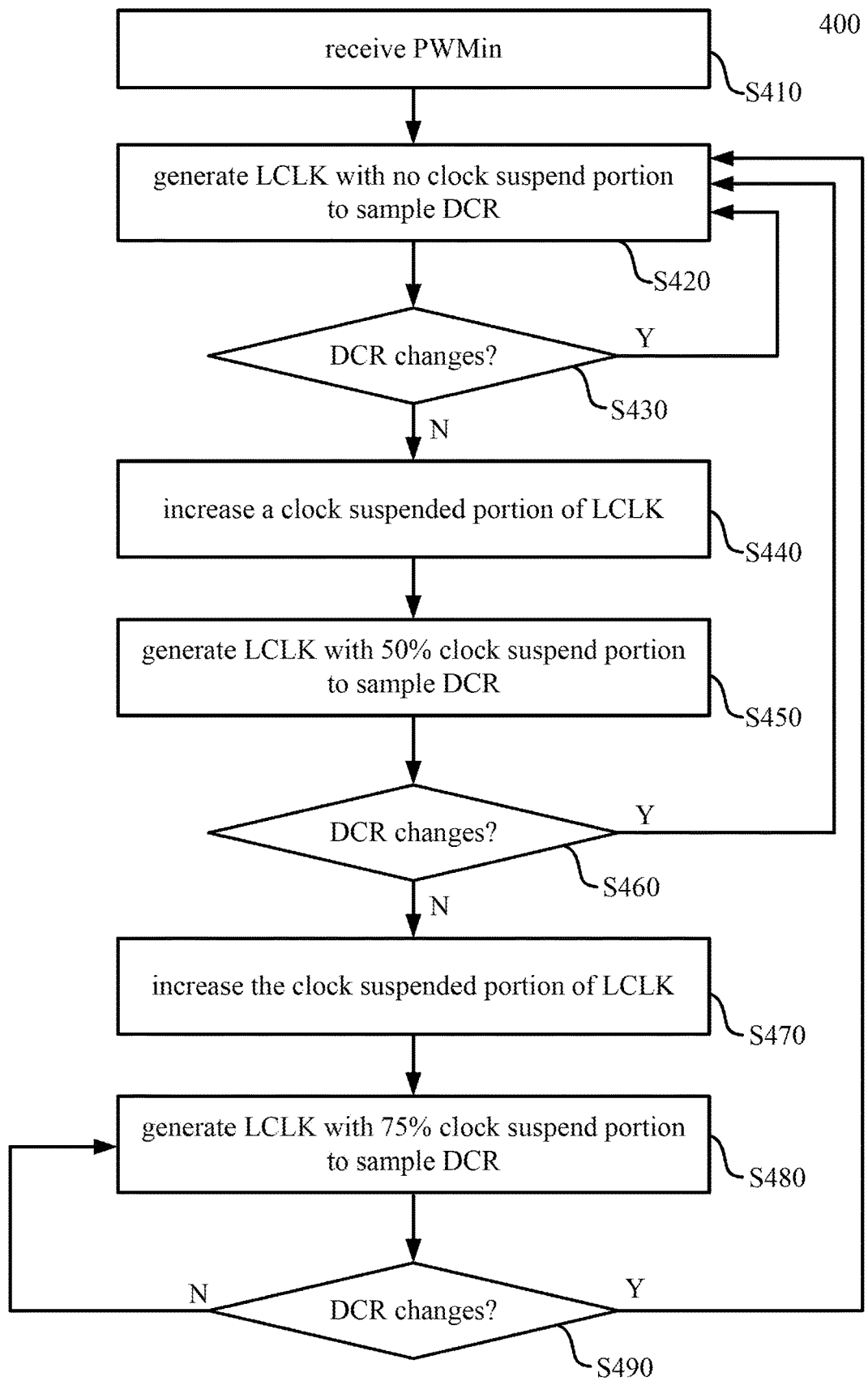
FIG. 9 is a flow chart diagram illustrating a control method performed by the driving circuit in FIG. 8.
Figure 10:
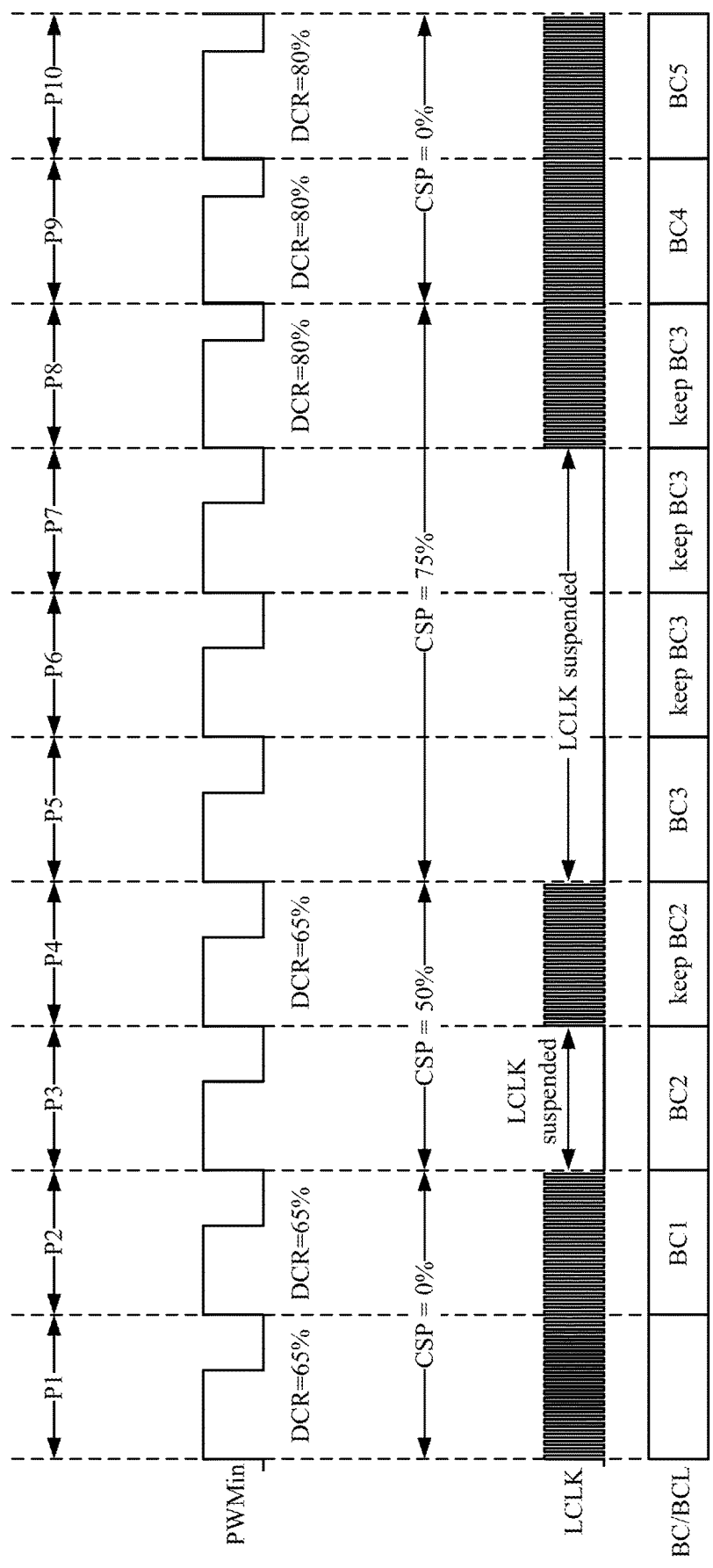
FIG. 10 is a waveform diagram illustrating a relationship between operating signals in an embodiment corresponding to the control method in FIG. 9.

Reference is further made to FIG. 9 and FIG. 10. FIG. 9 is a flow chart diagram illustrating a control method 400 performed by the driving circuit 300 in FIG. 8. FIG. 10 is a waveform diagram illustrating a relationship between operating signals in an embodiment corresponding to the control method 400 in FIG. 9. In step S410, the driving circuit 300 receives the PWM input signal PWMin. In step S420, the local clock generator 340 of the driving circuit 300 generate the local clock signal LCLK with no clock suspended portion according to the global clock signal GCLK, so as to sample the duty ratio DCR of the PWM input signal PWMin. As shown in FIG. 10, in both of the cycle period P1 and the cycle period P2, the local clock signal LCLK is generated with no clock suspended portion CSP to sample the duty ratio DCR of the PWM input signal PWMin.

As explained in aforesaid embodiments, the brightness code BC1 according to the duty ratio measured in P1. The brightness code BC2 according to the duty ratio measured in P2. The driving current DC to the light emitting diode 200 can be generated by the current source 380 according to the brightness code BC (including BC1 and BC2).

In step S430, the control circuit 390 can determine whether the duty ratio DCR of the PWM input signal PWMin changes. As embodiments shown in FIG. 10, the duty ratio DCR measured in the cycle period P1 is 65% and the duty ratio DCR measured in the cycle period P2 also 65%. Therefore, the control circuit 390 can decide that the duty ratio DCR of the PWM input signal PWMin does not change at the end of the cycle period P2, and the control method 400 can go to step S440.

In some embodiments, when the duty ratio DCR remains the same in step S430, the control method 400 can go to step S440 immediately.

In some other embodiments, when the duty ratio DCR remains the same in step S430, the control method 400 can not go to step S440 immediately, and the control method 400 can accumulate a persisting count of the duty ratio DCR remaining the same. The control method 400 can go to step S440 when the duty ratio DCR remaining the same for a first number of cycle periods such as 3 cycle periods, 5 cycle periods or 8 periods.

On the other hand, if the duty ratio DCR changes (not shown in FIG. 10), the control method 400 can return to step S420.

In step S440, the control circuit 390 increase the clock suspended portion CSP. In this embodiment, the control circuit 390 increase the clock suspended portion CSP to 50%. In step S450, the local clock signal LCLK is generated by the local clock generator 340 with 50% clock suspended portion CSP to sample the duty ratio DCR of the PWM input signal PWMin. When the clock suspended portion CSP is set at 50%, the local clock generator 340 suspends the oscillation of the local clock signal LCLK in one cycle period (such as the cycle period P3 in FIG. 10) and generates the local clock signal LCLK in the following cycle period (such as the cycle period P4 in FIG. 10).

As explained in aforesaid embodiments, the driving current DC during the cycle periods P3 and P4 can be generated by the current source 380 according to the brightness code BC2. At the end of the cycle period P3, the brightness code BC3 is calculated according to the duty ratio measured in the cycle period P3.

In step S460, the control circuit 390 can determine whether the duty ratio DCR of the PWM input signal PWMin changes at the end of the cycle period P4.

As embodiments shown in FIG. 10, the duty ratio DCR measured in the cycle period P4 is 65%, which is still the same as the duty ratio DCR measured in the cycle period P2. Therefore, the control circuit 390 can decide that the duty ratio DCR of the PWM input signal PWMin does not change at the end of the cycle period P4, and the control method 400 can go to step S470.

In some embodiments, when the duty ratio DCR remains the same in step S460, the control method 400 can go to step S470 immediately.

In some other embodiments, when the duty ratio DCR remains the same in step S460, the control method 400 can not go to step S470 immediately, and the control method 400 can accumulate a persisting count of the duty ratio DCR remaining the same. The control method 400 can go to step S470 when the duty ratio DCR remaining the same for a second number of cycle periods such as 3 cycle periods, 5 cycle periods, 8 periods, 10 cycle periods or 15 cycle periods. The second number can be the same as or different from the first number.

In step S470, the control circuit 390 increase the clock suspended portion CSP again. In this embodiment, the control circuit 390 increase the clock suspended portion CSP to 75%. In step S480, the local clock signal LCLK is generated by the local clock generator 340 with 75% clock suspended portion CSP to sample the duty ratio DCR of the PWM input signal PWMin. When the clock suspended portion CSP is set at 75%, the local clock generator 340 suspends the oscillation of the local clock signal LCLK in three cycle periods (such as the cycle periods P5-P7 in FIG. 10) and generates the local clock signal LCLK in the following cycle period (such as the cycle period P8 in FIG. 10). In other words, the status of local clock signal LCLK can be changed once during M cycle periods (M is an integer). In the case where the local clock signal LCLK is suspended for three cycle periods and oscillate normally during one cycle period, CP is 3/(1+3)=75%. It is noted that in some embodiments, the integer M can be varied, when the duty ratio is detected to be unchanged in step S490 of FIG. 9, for example, form 4 to 8, causing CSP to be from 75% to 87.5%.

As explained in aforesaid embodiments, the driving current DC during the cycle periods P5-P8 can be generated by the current source 380 according to the brightness code BC3. At the end of the cycle period P8, the brightness code BC4 is calculated according to the duty ratio measured in the cycle period P8.

In step S490, the control circuit 390 can determine whether the duty ratio DCR of the PWM input signal PWMin changes at the end of the cycle period P8.

As embodiments shown in FIG. 10, the duty ratio DCR measured in the cycle period P8 is 80%, which is different from the duty ratio DCR, 65%, measured in the cycle period P4. Therefore, the control circuit 390 can decide that the duty ratio DCR of the PWM input signal PWMin changes at the end of the cycle period P4, and the control method 400 can go to step S420, so as to generate the local clock signal LCLK with no clock suspended portion according to the global clock signal GCLK in the cycle periods P9 and P10 as shown in FIG. 10.

Based on aforesaid embodiments, the oscillation of the local clock signal LCLK is configured to be suspended during some clock suspended portions dynamically, in response to that the duty ratio DCR of the PWM input signal PWMin remains steady (for example, a displayer is showing a still context for a long time period). In this case, the power consumption of the PWM modulator and the driving circuit can be reduced. On the other hand, when the duty ratio DCR of the PWM input signal PWMin changes rapidly (for example, the displayer is showing a movie and a brightness of the pixel changes from a frame to another frame), the driving circuit 100/300 can resume the oscillation of the local clock signal LCLK.

Figure 11:
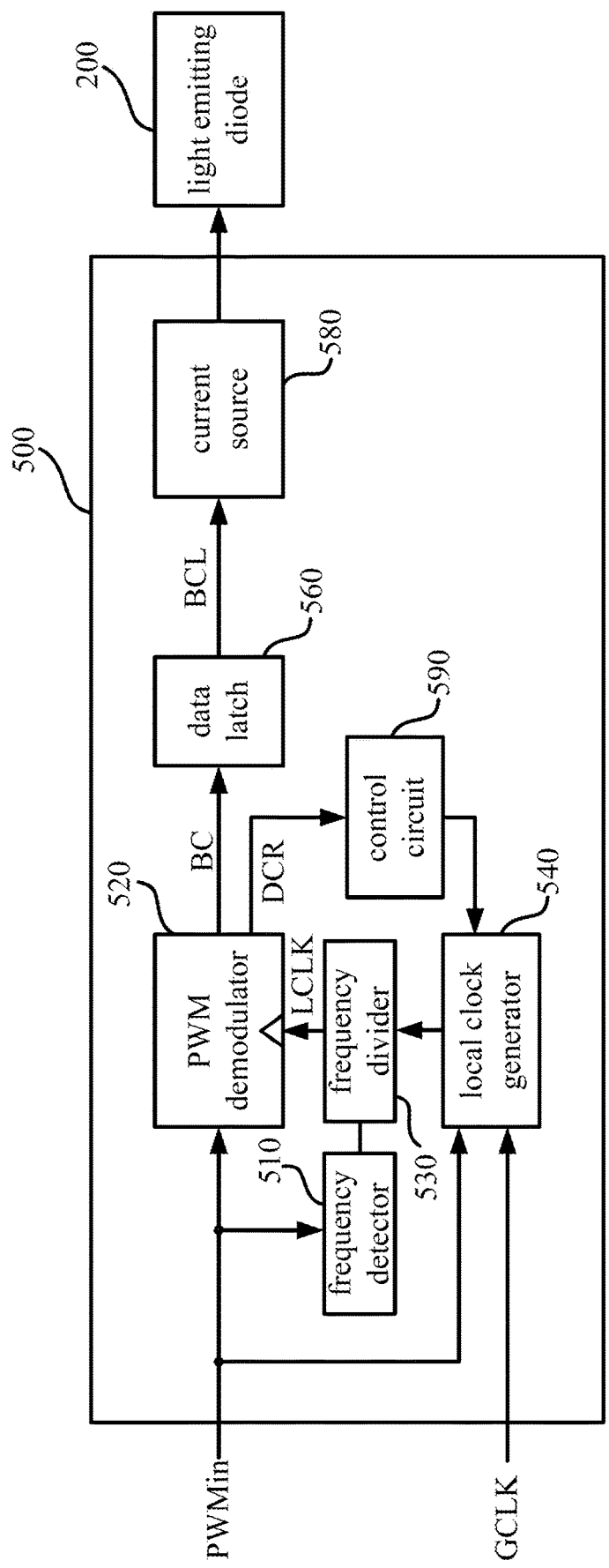
FIG. 11 a schematic diagram illustrating a driving circuit according to some embodiments of the disclosure.
Figure 12:
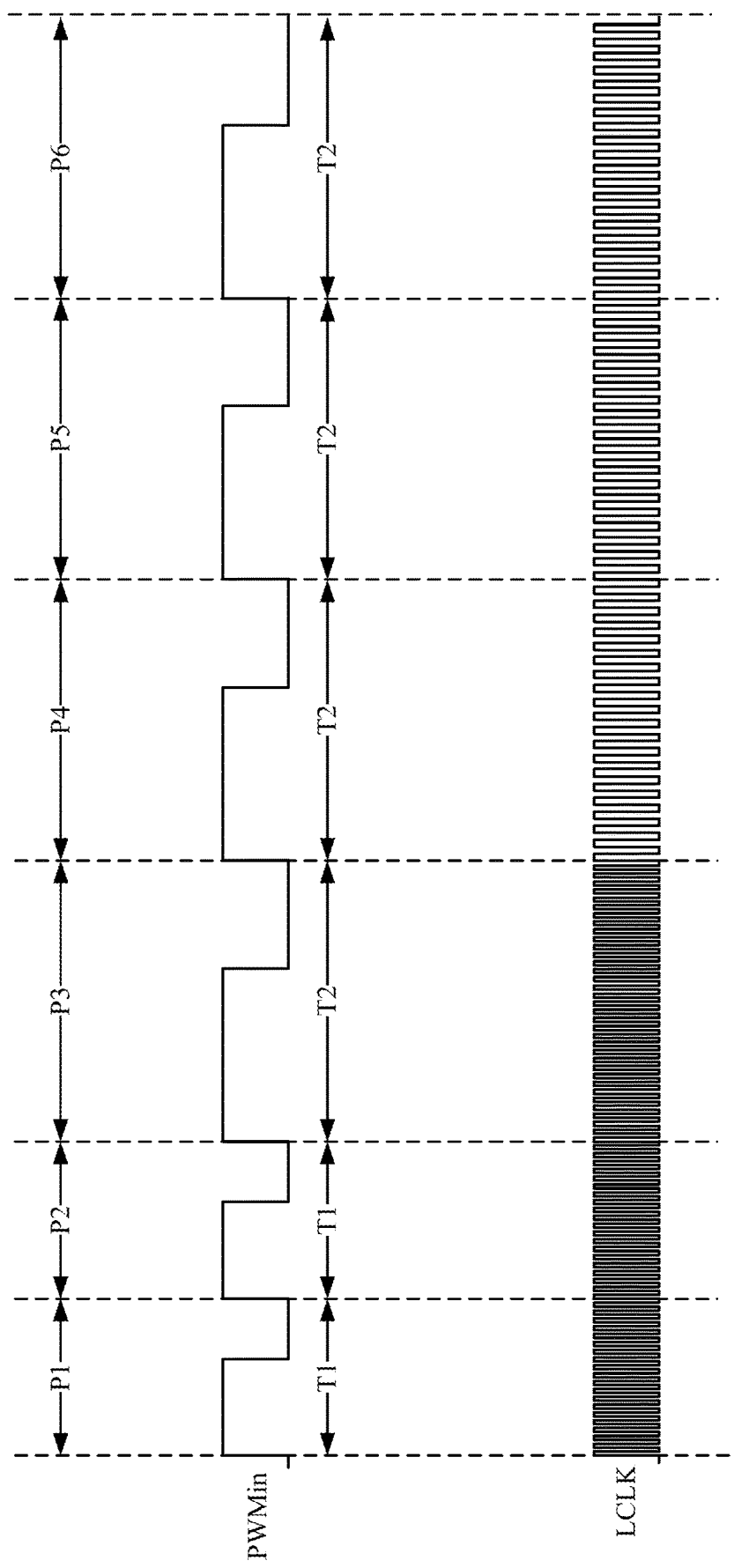
FIG. 12 is a waveform diagram illustrating a relationship between operating signals in an embodiment corresponding to the driving circuit in FIG. 11.

Reference is further made to FIG. 11 and FIG. 12. FIG. 11 a schematic diagram illustrating a driving circuit 500 according to some embodiments of the disclosure. FIG. 12 is a waveform diagram illustrating a relationship between operating signals in an embodiment corresponding to the driving circuit 500 in FIG. 11. The driving circuit 500 in FIG. 11 includes a PWM demodulator 520, a local clock generator 540, a data latch 560, a current source 580 and a control circuit 590, which are similar to the PWM demodulator 120/320, the local clock generator 140/340, the data latch 160/360, the current source 180/380 and the control circuit 390 in aforesaid embodiments in FIG. 1 and FIG. 2 and FIG. 8, and not to be repeated here.

In the embodiments shown in FIG. 11, the driving circuit 500 includes a frequency detector 510 and a frequency divider 530. The frequency detector 510 is configured to monitor a frequency of the PWM input signal PWMin. As shown in FIG. 12, the frequency detector 510 is able to calculate the time length between two rising edges of the PWM input signal PWMin. As shown in FIG. 12, during the cycle period P1 and the cycle period P2, the time length T1 between two rising edges is detected by the frequency detector 510. As shown in FIG. 12, during the cycle period P3, the time length T2 between two rising edges is detected by the frequency detector 510. Since the time length T2 is longer than the time length T1, the frequency detector 510 can detect the frequency of the PWM input signal PWMin decreases, from 1/T1 to 1/T2. When the frequency detector 510 detects the decrement of the frequency of the PWM input signal PWMin, the frequency divider 530 is configured to adjusting a frequency of the local clock signal LCLK in positive correlation with the frequency of the PWM input signal.

For example, if the frequency detector 510 detects that the frequency of the PWM input signal PWMin in the cycle periods P3-P6 is decrease to 60% of original frequency of the PWM input signal PWMin in the cycle periods P1 and P2, the frequency divider 530 is configured to adjusting a frequency of the local clock signal LCLK into 60% during the cycle periods P4-P6 of the original frequency of the local clock signal LCLK.

The adjustment to the frequency of the local clock signal LCLK can be in positive correlation with the frequency of the PWM input signal.

In some embodiments, the frequency of the local clock signal LCLK is determined by a resolution requirement of the brightness code BC/BCL. In an example, if the brightness code BC/BCL includes 8 data bits, the frequency of the local clock signal LCLK can be determined no less than $f_{PWM}*2^8*2$, in which $f_{PWM}$ means the frequency of the PWM input signal. In another example, if the brightness code BC/BCL includes 10 data bits, the frequency of the local clock signal LCLK can be determined no less than $f_{PWM}*2^{10}*2$.

When the frequency of the PWM input signal PWMin has a relative low frequency, there is no need to provide the local clock signal LCLK at a relative high frequency. When the local clock signal LCLK is provided at the relative high frequency, the PWM modulator 520 can be triggered at high frequency to sample and calculate the duty cycle of the PWM input signal PWMin, causing more power consumption on the PWM modulator 520. Based on embodiments shown in FIG. 11 and FIG. 12, the frequency detector 510 and the frequency divider 530 is able to adjust the frequency of the local clock signal LCLK to be corresponding to the frequency of the PWM input signal PWMin. Therefore, the driving circuit 500 is able to operate with a better power efficiency without decreasing a resolution of the brightness code BC/BCL.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. For example, different embodiments can be combined. In view of the foregoing, it is intended that the present invention cover modifications and variations of this invention provided they fall within the scope of the following claims.

What is claimed is:

1. A control method, comprising:
   receiving a pulse width modulation (PWM) input signal;
   during a first cycle period of successive cycle periods of the PWM input signal, generating a local clock signal at least according to a global clock signal;
   during the first cycle period, utilizing the local clock signal to sample and calculate a first duty ratio of a PWM input signal;
   updating a brightness code according to the first duty ratio;
   generating a driving current to a light emitting diode (LED) according to the brightness code; and during a second cycle period of the successive cycle periods of the PWM input signal after the first cycle period, suspending oscillation of the local clock signal.

2. The control method of claim 1, wherein the local clock signal is generated further according to the PWM input signal.

3. The control method of claim 2, further comprising:
converting the PWM input signal into at least one output signal; and
wherein the local clock signal is generated according to the at least one output signal and the global clock signal.

4. The control method of claim 1, wherein the oscillation of the local clock signal is suspended periodically.

5. The control method of claim 4, wherein the oscillation of the local clock signal is suspended during N cycle periods of successive M cycle periods of the PWM input signal, N and M are positive integers and N<M.

6. The control method of claim 1, comprising:
during a third cycle period of the successive cycle periods of the PWM input signal after the second cycle period, generating the local clock signal according to the global clock signal;
during the third cycle period, utilizing the local clock signal to sample and calculate a second duty ratio of the PWM input signal;
updating the brightness code according to the second duty ratio; and
generating the driving current to the LED according to the brightness code.

7. The control method of claim 6, comprising:
in response to the second duty ratio being equal to the first duty ratio, increasing a clock suspended portion of the local clock signal among the successive cycle periods of the PWM input signal; and
in response to the second duty ratio being different from the first duty ratio, reducing the clock suspended portion of the local clock signal among the successive cycle periods of the PWM input signal.

8. The control method of claim 1, comprising:
monitoring a frequency of the PWM input signal; and
adjusting a frequency of the local clock signal to be positively correlated with the frequency of the PWM input signal.

9. The control method of claim 1, comprising:
latching the brightness code; and
generating the driving current to the LED according to the latched brightness code.

10. A control method, comprising:
receiving a pulse width modulation (PWM) input signal;
during a first cycle period of successive cycle periods of the PWM input signal, generating a local clock signal at least according to a global clock signal;
during the first cycle period, utilizing the local clock signal to sample and calculate a first duty ratio of a PWM input signal;
during a second cycle period of the successive cycle periods of the PWM input signal, generating the local clock signal;
during the second cycle period, utilizing the local clock signal to sample and calculate a second duty ratio of the PWM input signal;
in response to the second duty ratio being equal to the first duty ratio, increasing a clock suspended portion of the local clock signal among the successive cycle periods of the PWM input signal; and
suspending oscillation of the local clock signal during the clock suspended portion of the successive cycle periods of the PWM input signal.

11. The control method of claim 10, comprising:
in response to the second duty ratio being different from the first duty ratio, resetting the clock suspended portion among the successive cycle periods to be zero.

12. The control method of claim 10, comprising:
updating a brightness code according to the first duty ratio or the second duty ratio; and
generating a driving current to the LED according to the brightness code.

13. The control method of claim 12, comprising:
during the clock suspended portion of the successive cycle periods of the PWM input signal, latching the brightness code configured in latest updating; and
generating the driving current to the LED according to the latched brightness code.

14. The control method of claim 10, comprising:
monitoring a frequency of the PWM input signal; and
adjusting a frequency of the local clock signal in positive correlation with the frequency of the PWM input signal.

15. A driving circuit, configured to provide a driving current to a light emitting diode (LED), the driving circuit comprising:
a PWM demodulator, configured to sample a PWM input signal in reference with a local clock signal and generate a brightness code according to a duty ratio of the PWM input signal;
a current source, coupled between the PWM demodulator and the LED, the current source being configured to generate the driving current with a current amplitude according to the brightness code; and
a local clock generator, configured to generate the local clock signal at least according to a global clock signal during a first cycle period of successive cycle periods of the PWM input signal, and suspend oscillation of the local clock signal during a second cycle period of the successive cycle periods of the PWM input signal.

16. The driving circuit of claim 15, wherein the local clock generator is configured to generate the local clock signal further according to the PWM input signal.

17. The driving circuit of claim 16, wherein the local clock generator comprises:
a converting circuit, configured to convert the PWM input signal into at least one output signal; and
a logic circuit configured to generate the local clock signal according to the at least one output signal and the global clock signal.

18. The driving circuit of claim 17, wherein the converting circuit comprises:
a first flip-flop, comprising a data input terminal, a clock terminal for receiving the PWM input signal, a positive data output terminal for providing a first output signal as one of the at least one output signal, and a negative data output terminal coupled with the data input terminal of the first flip-flop.

19. The driving circuit of claim 18, wherein the converting circuit further comprises:
a second flip-flop, comprising a data input terminal, a clock terminal for receiving the first output signal from the first flip-flop, a positive data output terminal for providing a second output signal as one of the at least one output signal, and a negative data output terminal coupled with the data input terminal of the second flip-flop.

20. The driving circuit of claim 17, wherein the logic circuit comprises a AND gate, comprising a plurality of input terminals configured to receive the at least one output signal of the converting circuit and the global clock signal, and an output terminal for providing the local clock signal.

21. The driving circuit of claim 15, wherein the PWM demodulator comprises:
    a first sample circuit configured to calculate a pulse width of the PWM input signal in reference with the local clock signal;
    a second sample circuit configured to calculate a time length of one cycle period of the PWM input signal in reference with the local clock signal; and
    a divider circuit, coupled with the first sampler and the second sampler, the divider circuit being configured to calculate the duty ratio according to the pulse width and the time length of one cycle period of the PWM input signal.

22. The driving circuit of claim 15, further comprising:
    a data latch, coupled between the PWM demodulator and the current source, the data latch being configured to latch the brightness code, wherein the current source generates the driving current according to the brightness code latched by the data latch.

23. The driving circuit of claim 15, wherein the local clock generator comprises:
    at least one flip-flop comprising one or a series of cascading connected flip-flops, a clock terminal of a first flip-flop of the at least one flip-flop being configured for receiving the PWM input signal, a positive data output terminal of a last flip-flop of the at least one flip-flop being configured for generating an output signal; and
    a AND gate, comprising two input terminals configured to receive the at least one output signal from the last flip-flop and the global clock signal respectively, and an output terminal for providing the local clock signal.

24. The driving circuit of claim 15, further comprising:
    a frequency detector, configured to monitor a frequency of the PWM input signal; and
    a frequency divider, coupled with the frequency detector, the local clock generator and the PWM demodulator, the frequency divider being configured to adjusting a frequency of the local clock signal to be positively correlated with the frequency of the PWM input signal.

25. The driving circuit of claim 15, wherein during a third cycle period of the successive cycle periods of the PWM input signal after the second cycle period, the local clock generator generates the local clock signal according to the global clock signal, during the third cycle period, the PWM demodulator utilizes the local clock signal to sample and calculate a second duty ratio of the PWM input signal, the PWM demodulator updates the brightness code according to the second duty ratio.

26. The driving circuit of claim 25, wherein in response to the second duty ratio being equal to the first duty ratio, the local clock generator increases a clock suspended portion of the local clock signal among the successive cycle periods of the PWM input signal, and
    in response to the second duty ratio being different from the first duty ratio, the local clock generator reduces the clock suspended portion of the local clock signal among the successive cycle periods of the PWM input signal.

* * * * *